United States Patent
Hirose et al.

(10) Patent No.: US 9,847,104 B2
(45) Date of Patent: Dec. 19, 2017

(54) ELECTRONIC APPARATUS

(71) Applicant: Sony Interactive Entertainment Inc., Tokyo (JP)

(72) Inventors: Kenji Hirose, Tokyo (JP); Kazuto Nakagawa, Kanagawa (JP); Shinya Tsuchida, Tokyo (JP); Yasuhiro Ootori, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 15/458,556

(22) Filed: Mar. 14, 2017

(65) Prior Publication Data

US 2017/0287527 A1    Oct. 5, 2017

(30) Foreign Application Priority Data

Mar. 31, 2016  (JP) ................. 2016-073336

(51) Int. Cl.
| | | |
|---|---|---|
| G11B 33/14 | (2006.01) | |
| H05K 7/20 | (2006.01) | |
| G06F 1/16 | (2006.01) | |
| H05K 7/14 | (2006.01) | |
| G06F 1/18 | (2006.01) | |

(52) U.S. Cl.
CPC .......... *G11B 33/142* (2013.01); *G06F 1/1616* (2013.01); *H05K 7/1422* (2013.01); *H05K 7/20136* (2013.01); *G06F 1/181* (2013.01)

(58) Field of Classification Search
CPC ............ H05K 7/1422; H05K 7/20136; H05K 5/0008; H05K 7/20145; G06F 1/181; G06F 1/20; G06F 1/1616
See application file for complete search history.

(56) References Cited

U.S. PATENT DOCUMENTS

| | | | | |
|---|---|---|---|---|
| 4,894,749 A | * | 1/1990 | Elko ................. | G06F 1/20 165/104.33 |
| 5,552,967 A | * | 9/1996 | Seto ................. | G06F 1/1616 174/387 |
| 5,587,855 A | * | 12/1996 | Kim ................. | G11B 33/08 360/99.16 |
| 5,590,024 A | * | 12/1996 | Honda .............. | G06F 1/1616 361/679.32 |
| 5,715,139 A | * | 2/1998 | Nakajima ......... | G06F 1/1616 361/679.55 |
| 5,732,063 A | * | 3/1998 | Chen ............... | G11B 33/08 360/97.12 |
| 5,748,444 A | * | 5/1998 | Honda .............. | G06F 1/1616 361/679.09 |

(Continued)

FOREIGN PATENT DOCUMENTS

WO    2014185311 A1    11/2014

*Primary Examiner* — Brian Miller
(74) *Attorney, Agent, or Firm* — Matthew B. Dernier, Esq.

(57) ABSTRACT

An electronic apparatus includes a plurality of parts, a frame having an outer periphery surrounding the plurality of parts and formed from resin, a circuit board disposed at one side in a first direction with respect to the plurality of parts, a chassis disposed at the one side in the first direction with respect to the plurality of parts, attached to the frame, and formed from metal, and a metal plate disposed at the other side in the first direction with respect to at least one of the plurality of parts and attached to the frame.

7 Claims, 10 Drawing Sheets

(56) References Cited

U.S. PATENT DOCUMENTS

| | | | | |
|---|---|---|---|---|
| 5,870,248 A * | 2/1999 | Akutsu | G11B 19/2009 | 360/99.04 |
| 5,898,537 A * | 4/1999 | Oizumi | G11B 17/028 | 360/99.18 |
| 6,023,392 A * | 2/2000 | Kim | G11B 25/043 | 29/603.03 |
| 6,034,841 A * | 3/2000 | Albrecht | G11B 25/043 | 360/99.17 |
| 6,574,099 B2 * | 6/2003 | Lindrose | G11B 33/08 | 360/137 |
| 6,742,573 B2 * | 6/2004 | Sasaki | H01L 23/3672 | 165/185 |
| 7,154,749 B2 * | 12/2006 | Stefanoski | G06F 1/20 | 165/104.33 |
| 7,245,487 B2 * | 7/2007 | Yagi | G06F 1/20 | 165/104.33 |
| 7,254,035 B2 * | 8/2007 | Sasaki | G06F 1/20 | 361/721 |
| 7,301,776 B1 * | 11/2007 | Wang | G06F 12/1416 | 360/137 |
| 7,755,896 B2 * | 7/2010 | Tamaki | G06F 1/20 | 165/80.2 |
| 7,813,129 B2 * | 10/2010 | Van Der Werff | H05K 7/20727 | 361/679.48 |
| 8,570,735 B2 * | 10/2013 | Tang | G06F 1/20 | 361/679.54 |
| 8,625,232 B2 * | 1/2014 | Tashiro | G11B 25/043 | 360/97.19 |
| 8,837,141 B2 * | 9/2014 | Clayton | H05K 1/147 | 29/830 |
| 9,059,146 B2 * | 6/2015 | Inoue | G06F 1/20 | |
| 9,122,452 B2 * | 9/2015 | Noborio | G06F 1/1658 | |
| 2003/0011928 A1 * | 1/2003 | Yanase | G11B 17/0405 | 360/99.06 |
| 2004/0150909 A1 * | 8/2004 | Kimura | G11B 25/043 | 360/99.13 |
| 2014/0036440 A1 * | 2/2014 | Inoue | H01L 23/467 | 361/692 |
| 2016/0088760 A1 * | 3/2016 | Yukito | G06F 1/20 | 361/679.48 |
| 2016/0120061 A1 * | 4/2016 | Tetsu | G06F 1/20 | 361/679.48 |

* cited by examiner

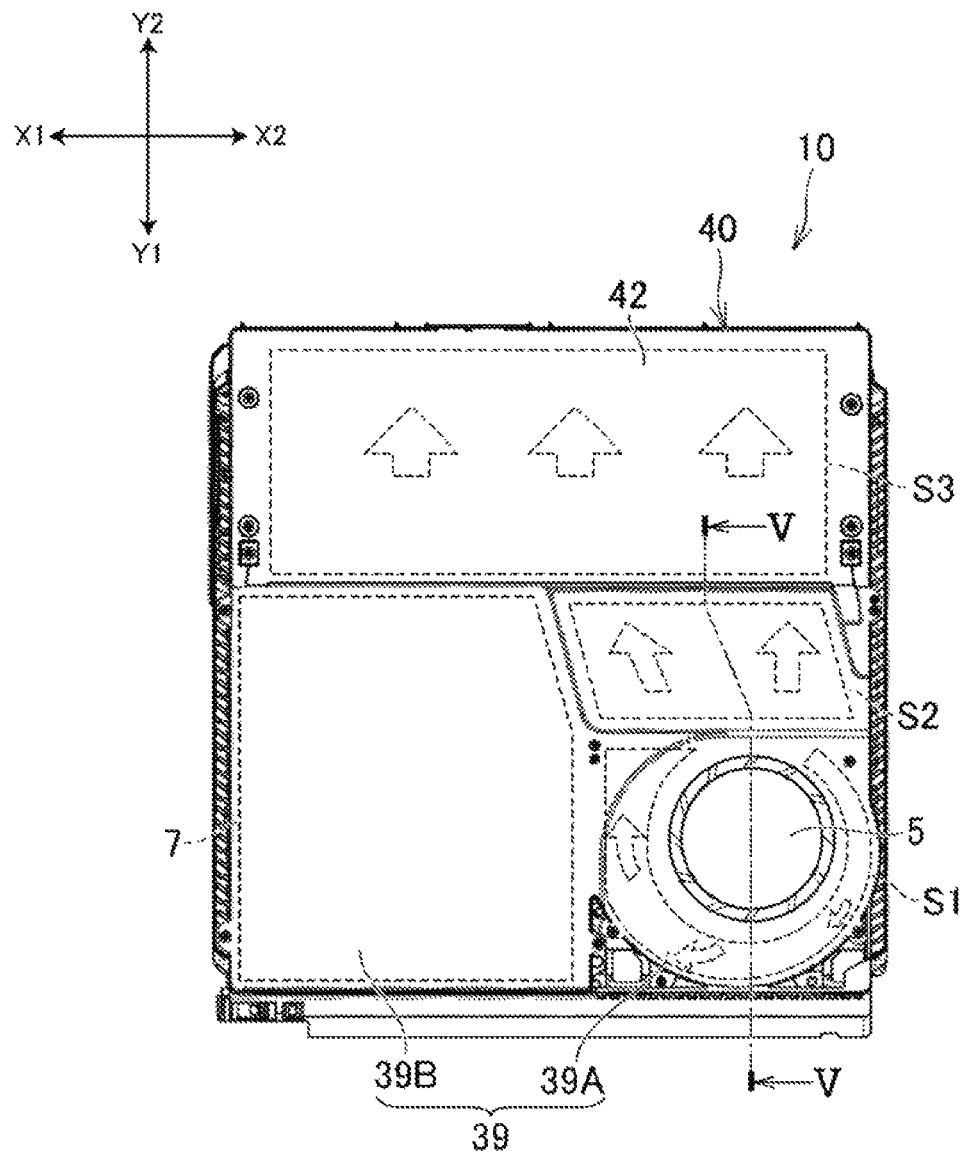

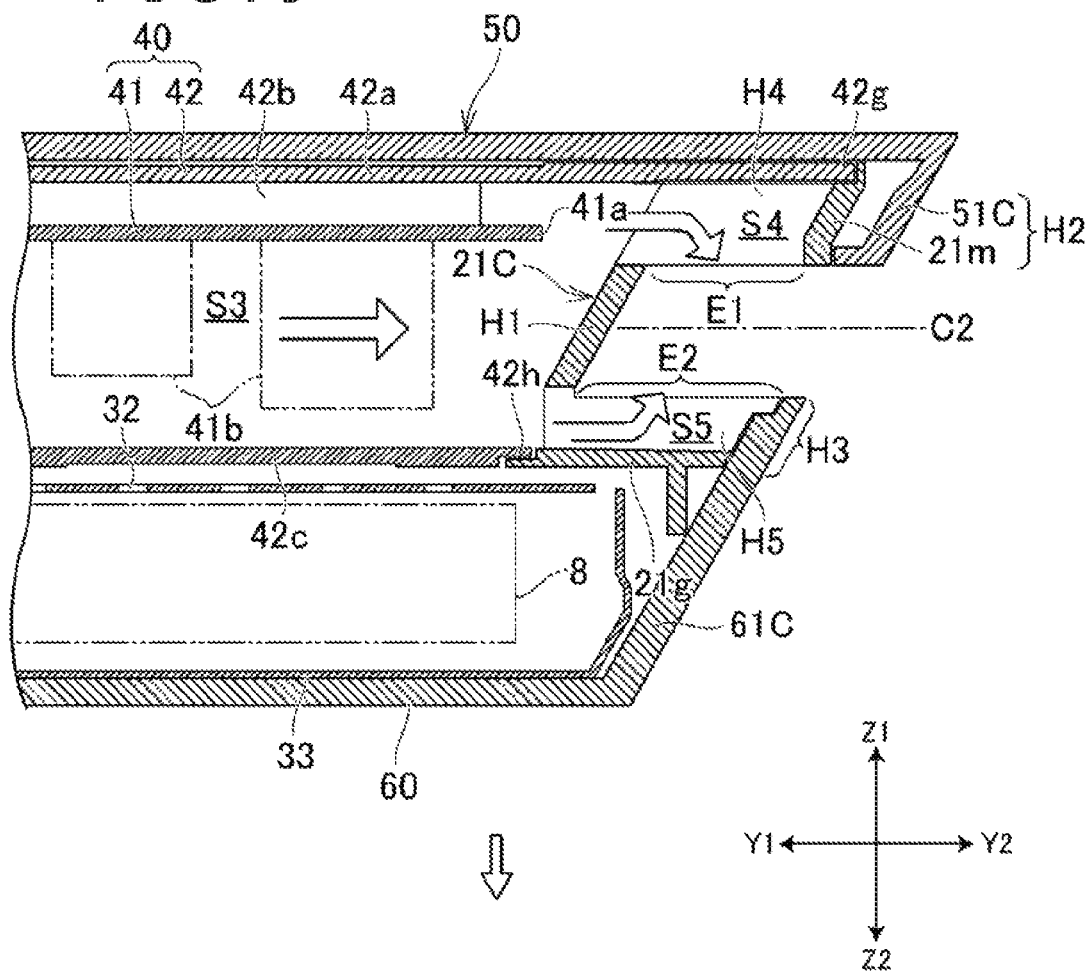

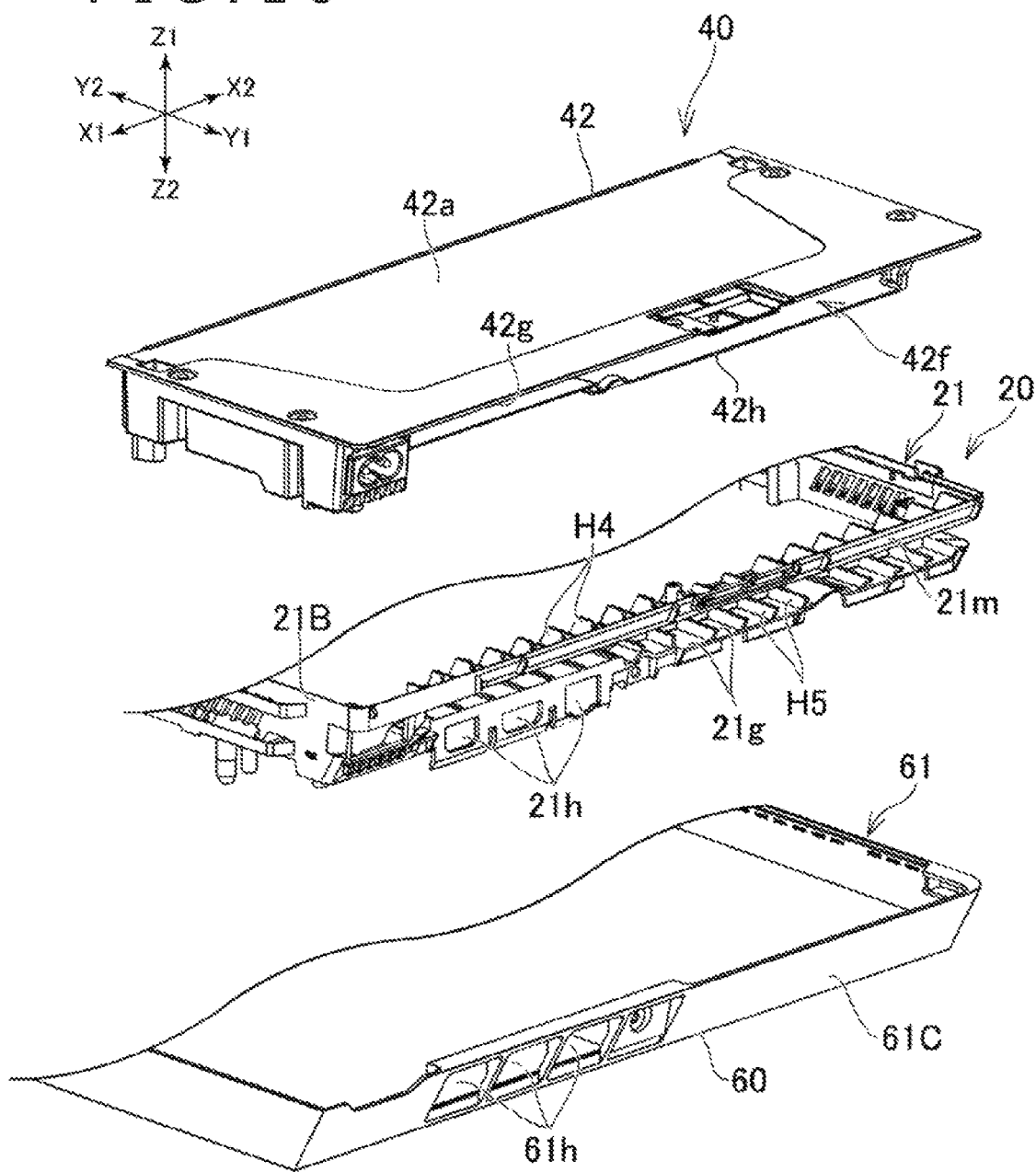

ELECTRONIC APPARATUS

BACKGROUND

The present technology relates to a structure of a vent of an electronic apparatus.

An electronic apparatus is disclosed in PCT Patent Publication No. WO2014/185311 (hereinafter referred to as Patent Document 1) which includes a frame to which various parts provided in the electronic apparatus are attached, an upper cover that covers the upper side of the frame, and a lower cover that covers the lower side of the frame. The frame has an outer periphery formed so as to surround the various parts provided in the electronic apparatus (particularly, a cooling fan, a heatsink, a power supply unit, an optical disk drive and so forth). A circuit board is disposed at the upper side of the cooling fan and the heatsink. The circuit board is covered with a chassis formed from metal.

SUMMARY

In the electronic apparatus of Patent Document 1, the frame is entirely formed from resin. In order to enhance the rigidity of the frame, it may be necessary to increase the thickness or the size of the frame. This is not preferable in order to achieve downsizing of the electronic apparatus.

There is a need for the present technology to provide an electronic apparatus capable of enhancing the rigidity of a frame while achieving downsizing of the electronic apparatus.

According to an embodiment of the present technology, there is provided an electronic apparatus including a plurality of parts, a frame having an outer periphery surrounding the plurality of parts and formed from resin, a circuit board disposed at one side in a first direction with respect to the plurality of parts, a chassis disposed at the one side in the first direction with respect to the plurality of parts, attached to the frame, and formed from metal, and a metal plate disposed at an other side in the first direction with respect to at least one of the plurality of parts and attached to the frame.

The above and other objects, features and advantages of the present technology will become apparent from the following description and the appended claims, taken in conjunction with the accompanying drawings in which like parts or elements are denoted by like reference characters.

BRIEF DESCRIPTION OF THE DRAWINGS

FIG. 4A is a top plan view of the main body of the electronic apparatus;

FIG. 9 is a sectional view taken along line IX-IX of FIG. 8; and

FIG. 10 is a perspective view depicting a rear side of the frame, a power supply unit, and a lower cover.

DETAILED DESCRIPTION OF THE PREFERRED EMBODIMENT

Figure 1:
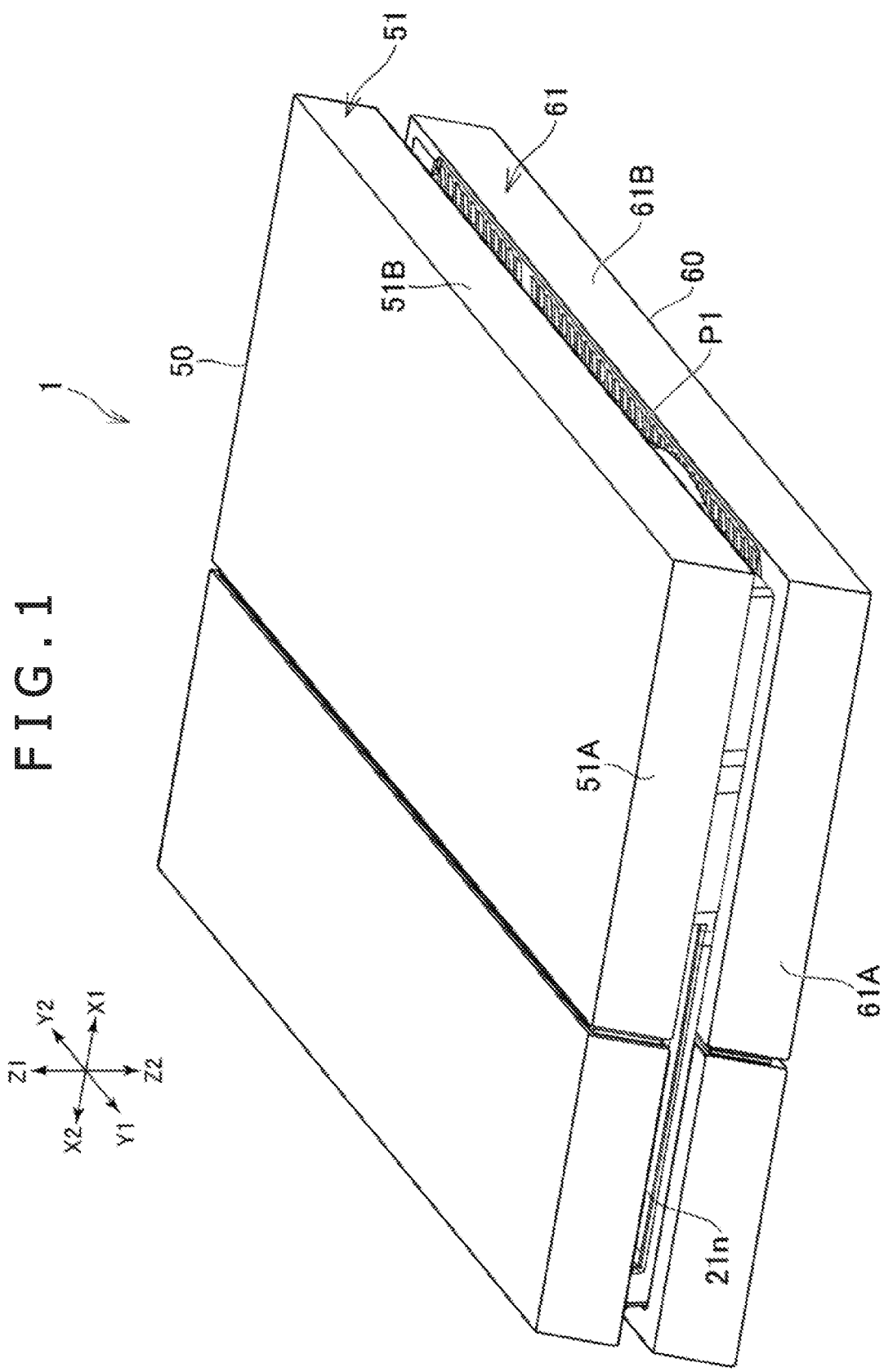
FIG. 1 is a perspective view of an electronic apparatus according to an embodiment of the present technology.
Figure 2:
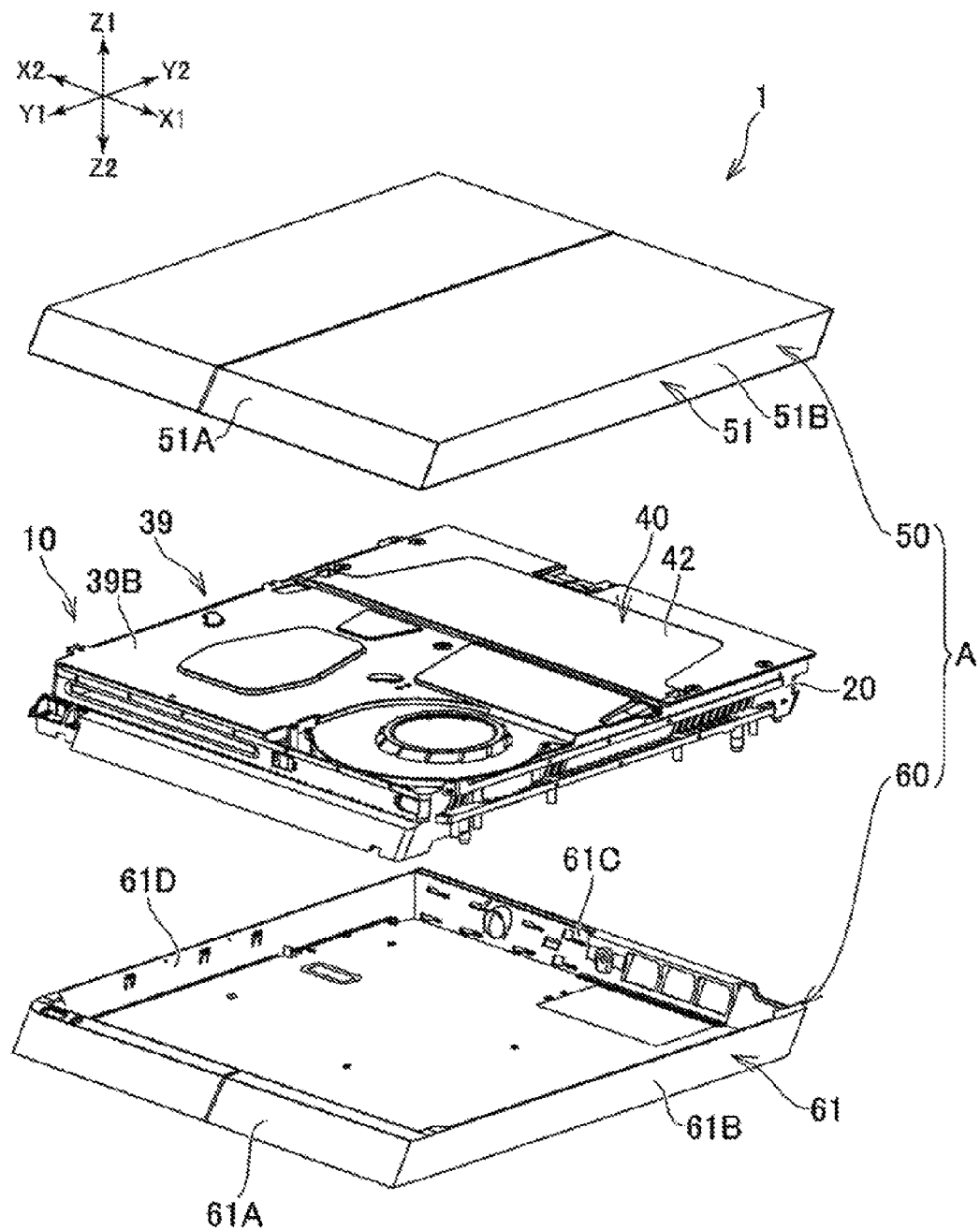
FIG. 2 is an exploded perspective view of the electronic apparatus.
Figure 3:
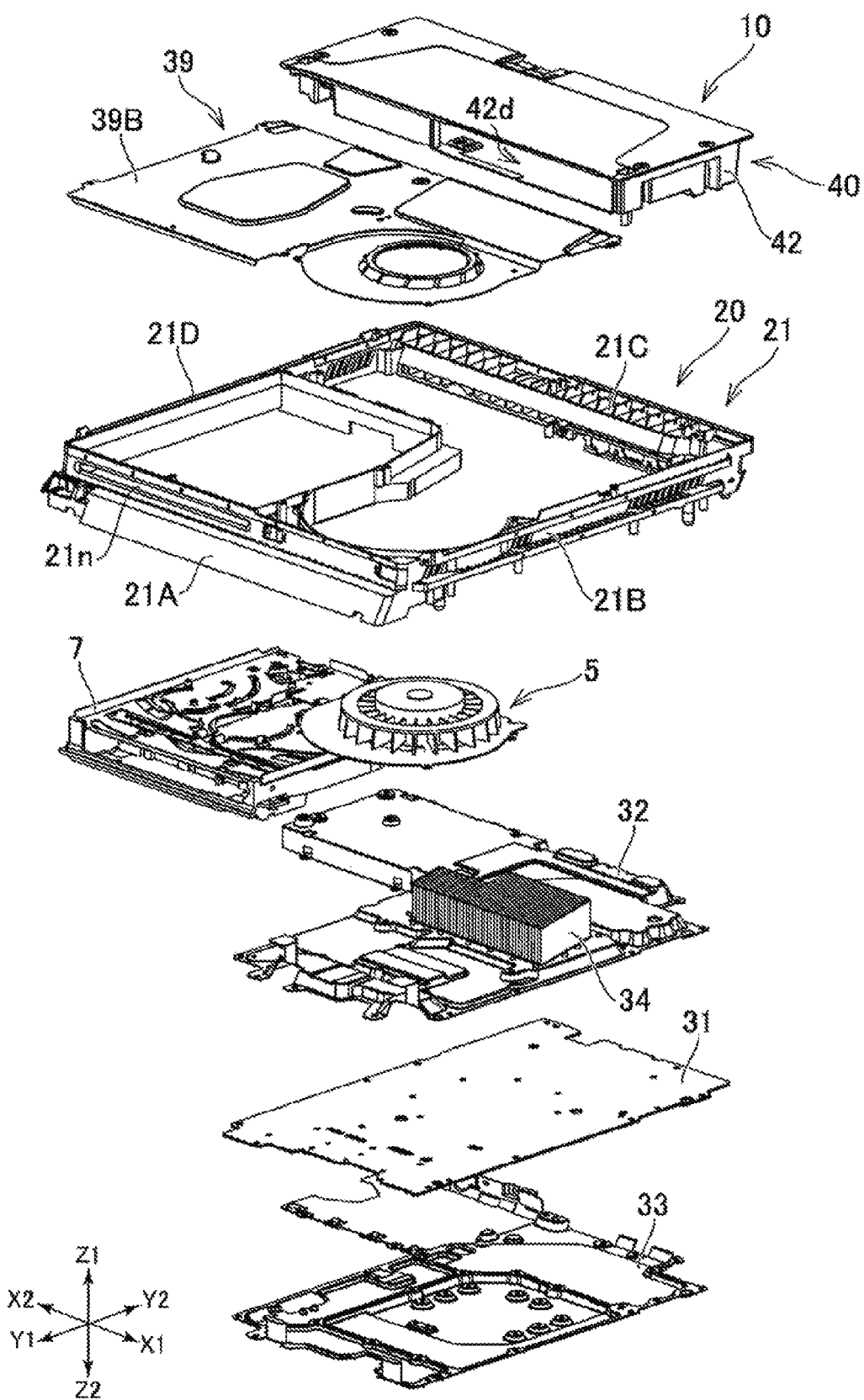
FIG. 3 is an exploded perspective view of a main body depicted in FIG. 2.
Figure 4B:
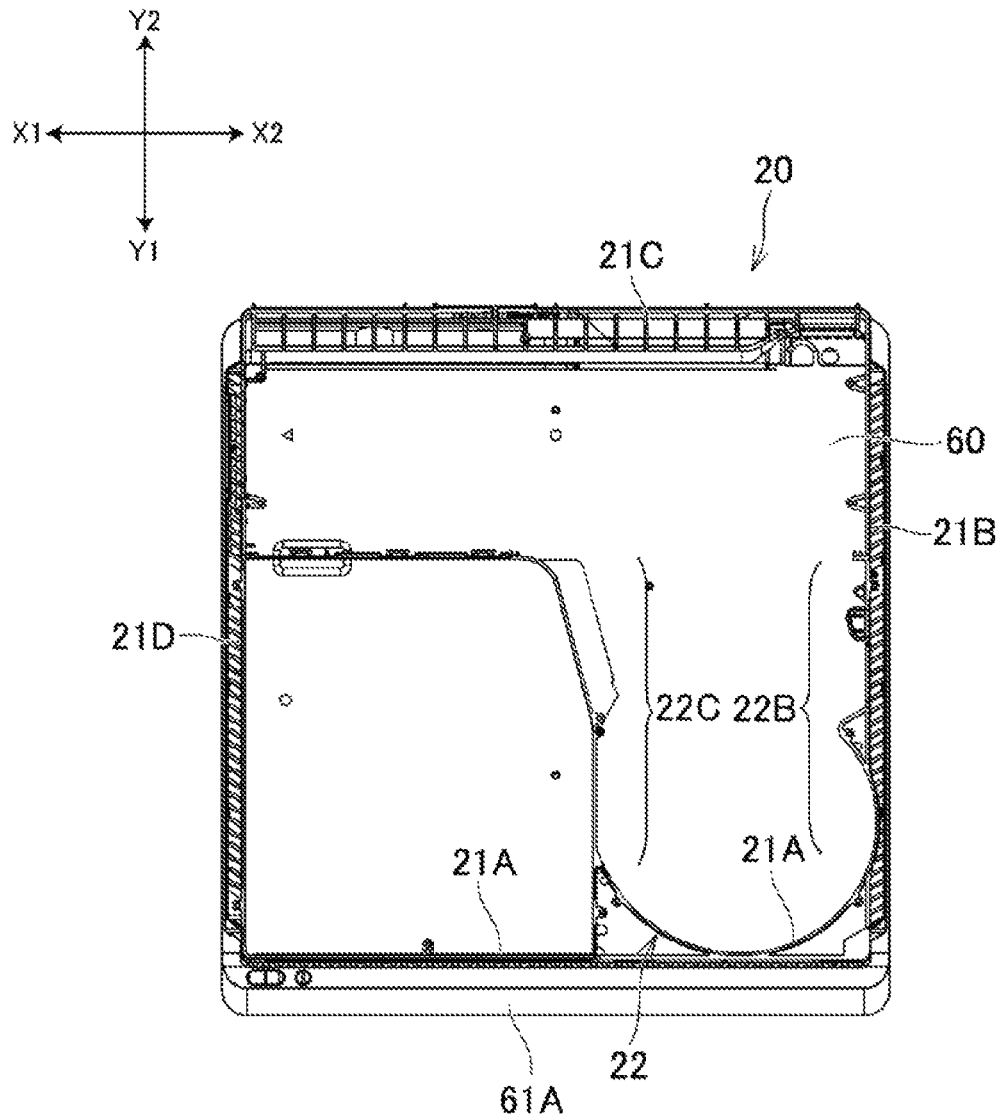
FIG. 4B is a top plan view of a frame to which a lower cover is attached.
Figure 5:
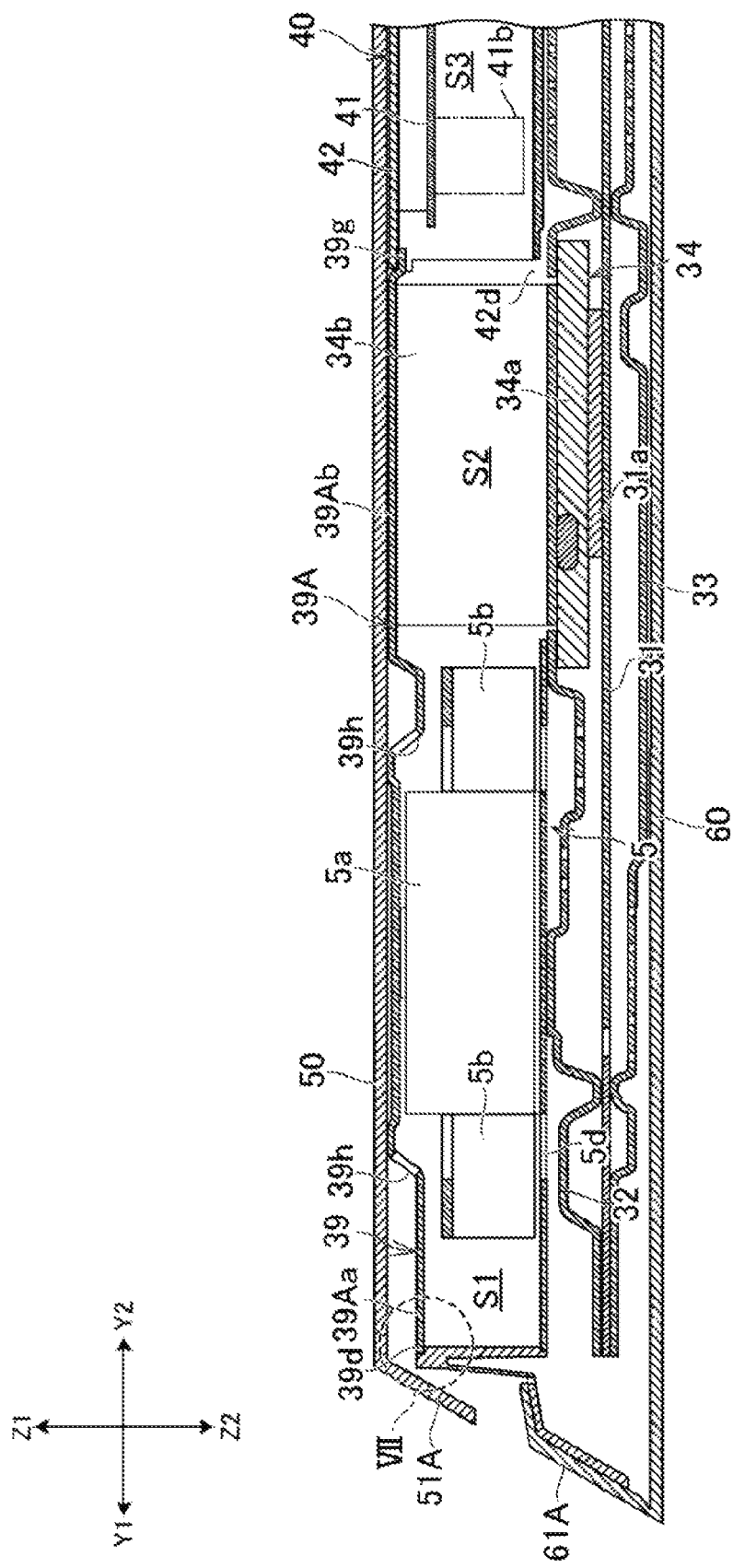
FIG. 5 is a sectional view of the electronic apparatus taken along line V-V of FIG. 4A.
Figure 6:
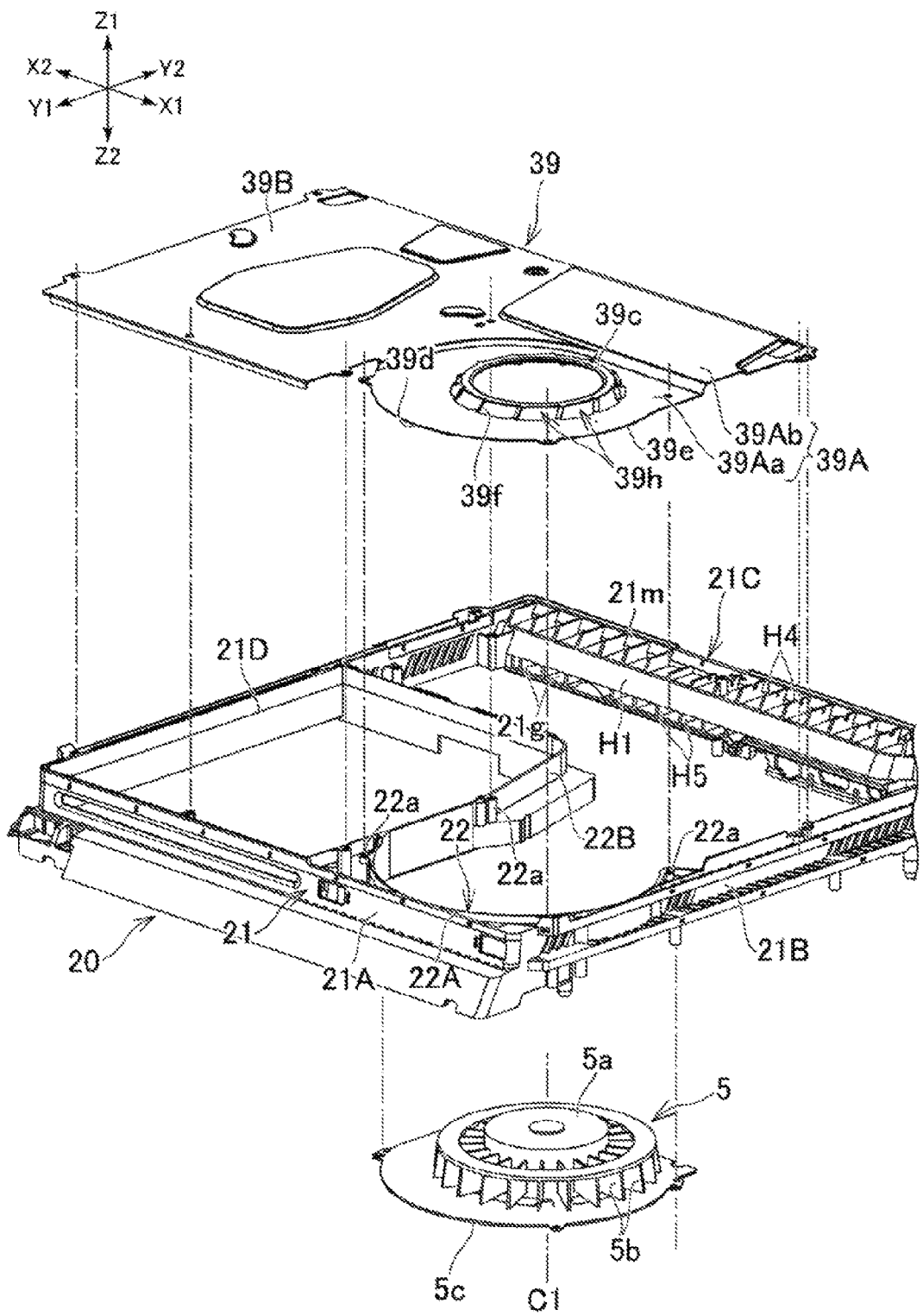
FIG. 6 is a perspective view of a metal plate, the frame, and a cooling fan depicted in FIG. 3.

In the following, an embodiment of the present technology is described with reference to the drawings. FIG. 1 is a perspective view of an electronic apparatus 1 according to the embodiment of the present technology. FIG. 2 is an exploded perspective view of the electronic apparatus 1. FIG. 3 is an exploded perspective view of a main body 10 depicted in FIG. 2. FIG. 4A is a top plan view of the main body 10. FIG. 4B is a top plan view of a frame 20 to which a lower cover 60 is attached. FIG. 5 is a sectional view of the electronic apparatus 1 taken along line V-V of FIG. 4A. FIG. 6 is a perspective view of a metal plate 39, the frame 20, and a cooling fan 5 depicted in FIG. 3.

In the description given below, reference characters X1, X2, Y1, Y2, Z1, and Z2 depicted in FIG. 1 indicate a leftward direction, a rightward direction, a forward direction, a rearward direction, an upward direction, and a downward direction, respectively.

The electronic apparatus 1 is an entertainment apparatus that functions, for example, as a game apparatus or an audio/visual apparatus. The electronic apparatus 1 outputs moving picture data generated by executing a game program or video/audio data acquired from a recording medium such as an optical disk and/or video/audio data acquired through a network to a display apparatus such as a television set. The electronic apparatus 1 is not limited to an entertainment apparatus such as a game apparatus and may be a personal computer.

As depicted in FIG. 2, the electronic apparatus 1 includes a main body 10. The upper side of the main body 10 is covered with an upper cover 50 that configures an exterior member A of the electronic apparatus 1. The lower side of the main body 10 is covered with the lower cover 60 that configures the exterior member A. As depicted in FIG. 3, the main body 10 is configured from the frame 20 and various parts attached to the frame 20. As hereinafter described, in the example of the electronic apparatus 1, also the frame 20 configures the exterior member A.

As depicted in FIG. 3, for example, the cooling fan 5, an optical disk drive 7, a power supply unit 40 and so forth are attached to the frame 20. In the example of the electronic apparatus 1, the cooling fan 5 and the optical disk drive 7 are disposed at a front portion of the electronic apparatus 1 and are juxtaposed in a leftward and rightward direction. The power supply unit 40 is disposed behind the cooling fan 5 and the optical disk drive 7. The power supply unit 40 has a case 42. A circuit board 41 (refer to FIG. 5) on which a power supply circuit is mounted is accommodated in the case 42. The layout of the parts provided in the electronic apparatus 1, namely, the layout of the cooling fan 5, the optical disk drive 7, and the power supply unit 40, is not limited to the example of the electronic apparatus 1. Further, the electronic apparatus 1 may not necessarily include all of the components described above. For example, the electronic apparatus 1 may not include the optical disk drive 7.

As depicted in FIG. 3, the frame 20 has a frame outer periphery 21. The frame outer periphery 21 surrounds a plurality of parts provided in the electronic apparatus 1. In the example of the electronic apparatus 1, the frame outer periphery 21 surrounds the optical disk drive 7, the cooling fan 5, and the power supply unit 40 described above (refer to FIG. 4A). The frame outer periphery 21 has a substantially square shape as viewed in top plan and has a front wall portion 21A, a right wall portion 21B, a rear wall portion 21C, and a left wall portion 21D. The front wall portion 21A is a wall portion positioned in front of the parts described above. An insertion opening 21n for insertion of an optical disk into the optical disk drive 7 may be formed at the front wall portion 21A. The rear wall portion 21C is a wall portion positioned at the opposite side to the front wall portion 21A. The right wall portion 21B is positioned in the rightward direction with respect to the parts described above, and the left wall portion 21D is a wall portion positioned at the opposite side to the right wall portion 21B. The inner side of the frame outer periphery 21 is open in the vertical direction. In particular, the frame outer periphery 21 has a cylindrical shape.

As depicted in FIG. 3, the main body 10 includes a circuit board 31, an upper chassis 32, and a lower chassis 33. The chassis 32 and 33 are configured from a plate of metal such as aluminum or iron and covers the upper face and the lower face of the circuit board 31, respectively. Electronic parts such as an integrated circuit that controls the electronic apparatus 1 or executes an image process and so forth are mounted on the circuit board 31. The chassis 32 and 33 prevent radiation of an electromagnetic wave outputted from the parts such as an integrated circuit and prevent an electromagnetic wave from an external apparatus from having an influence on the electronic parts on the circuit board 31. In an example, the chassis 32 and 33 entirely cover the circuit board 31. However, the chassis 32 and 33 may cover only a region of the circuit board 31 in which the parts such as an integrated circuit 31a are mounted.

The circuit board 31 and the chassis 32 and 33 are disposed at the lower side of the parts described hereinabove disposed at the inner side of the frame outer periphery 21. In the example of the electronic apparatus 1, the circuit board 31 and the chassis 32 and 33 are positioned at the lower side of the cooling fan 5 and the power supply unit 40 (refer to FIG. 5). The circuit board 31 and the chassis 32 and 33 are attached to the frame 20. More particularly, the circuit board 31 and the chassis 32 and 33 are attached to the frame outer periphery 21. In the example of the electronic apparatus 1, the circuit board 31 and the chassis 32 and 33 are attached to the front wall portion 21A, the right wall portion 21B, and the rear wall portion 21C of the frame outer periphery 21. A fixture such as, for example, a machine screw is utilized for attachment of the circuit board 31 and the chassis 32 and 33. The electronic apparatus 1 may not necessarily include the two chassis 32 and 33. In other words, a chassis may be provided only on one face of the circuit board 31.

As depicted in FIG. 3, the electronic apparatus 1 has a heatsink 34. The heatsink 34 is in direct or indirect contact with a heat generating part such as the integrated circuit 31a (refer to FIG. 5) mounted on the circuit board 31. The heatsink 34 is disposed in an air flow path S2 (refer to FIG. 4A) hereinafter described which extends from the cooling fan 5. In the example of the electronic apparatus 1, the heatsink 34 is attached to the upper chassis 32. In particular, as depicted in FIG. 5, the heatsink 34 has a base portion 34a and a plurality of fins 34b fixed to the upper side of the base portion 34a. The upper chassis 32 has formed therein a hole of a size corresponding to the heatsink 34, and the fins 34b of the heatsink 34 are fitted in the hole of the upper chassis 32 from the lower side. The heatsink 34 is fixed at the base portion 34a thereof to an edge of the hole of the upper chassis 32. The fins 34b are positioned at the upper side of the upper chassis 32 and positioned in the air flow path S2. The attachment structure of the heatsink 34 is not limited to the example of the electronic apparatus 1 but may be modified suitably.

As depicted in FIG. 3, the electronic apparatus 1 includes the metal plate 39. The metal plate 39 is disposed at the opposite side to the chassis 32 and 33 and the circuit board 31 across the cooling fan 5. In the example of the electronic apparatus 1, the metal plate 39 is disposed at the upper side of the cooling fan 5. Further, the metal plate 39 is attached to the frame 20. More particularly, the metal plate 39 is attached to the frame outer periphery 21. The frame 20 is formed from an acrylonitrile butadiene styrene (ABS) resin, a resin of polystyrene or the like. Meanwhile, the metal plate 39 is formed from a metal such as aluminum or iron. With such a structure that utilizes the metal plate 39 as just described, the rigidity of the frame 20 can be enhanced without increasing the thickness of the wall portions 21A, 21B, 21C, and 21D of the frame 20.

Preferably, the metal plate 39 is attached to at least three ones from among the four wall portions 21A, 21B, 21C, and 21D that configure the frame outer periphery 21. The structure just described can more effectively enhance the rigidity of the frame outer periphery 21. As depicted in FIG. 6, in the example of the electronic apparatus 1, the metal plate 39 is attached to the right wall portion 21B, the front wall portion 21A, and the left wall portion 21D of the frame outer periphery 21. In an example, the metal plate 39 is attached to an upper edge of the frame outer periphery 21. As another example, an attachment portion may be formed at the inner side of the frame outer periphery 21 such that the metal plate 39 is attached to the attachment portion. For the attachment of the metal plate 39, a fixture such as, for example, a machine screw is utilized.

The attachment structure of the metal plate 39 is not limited to the example described here. For example, the metal plate 39 may be attached only two ones from among the four wall portions 21A, 21B, 21C, and 21D of the frame outer periphery 21. As hereinafter described, the metal plate 39 functions as a wall that covers the cooling fan 5 and defines an air flow path. Accordingly, the metal plate 39 may be attached to only two wall portions positioned proximate to the cooling fan 5 (in the example of the electronic apparatus 1, to the front wall portion 21A and the right wall portion 21B). As a further example, the metal plate 39 may be attached to all of the four wall portions 21A, 21B, 21C, and 21D. In this case, the metal plate 39 may cover all parts disposed at the inner side of the frame outer periphery 21 or may cover only part of the parts disposed at the inner side of the frame outer periphery 21.

As described hereinabove, the electronic apparatus 1 has the cooling fan 5 and the heatsink 34 disposed on the inner side of the frame outer periphery 21. Further, the electronic apparatus 1 has vents E1 and E2 (refer to FIG. 9). Here, the term "vent" signifies a boundary between the outside and the inside of the exterior member A of the electronic apparatus 1. In particular, external air exists at the outside of the vents E1 and E2, and air in the exterior member A becomes external air at an instant at which it passes the vents E1 and E2. The electronic apparatus 1 has, as the vents E1 and E2, exhaust ports for exhausting air in the exterior member A to the outside. In the example of the electronic apparatus 1, the exhaust ports E1 and E2 are provided in the rear wall portion 21C of the frame outer periphery 21. At the inner side of the frame outer periphery 21, air flow paths S1, S2, and S3 are formed which extend from the cooling fan 5 to the exhaust ports E1 and E2 (refer to FIG. 4A).

In the example of the electronic apparatus 1, the cooling fan 5 is disposed such that a rotational center line Cl thereof (refer to FIG. 6) extends in the vertical direction. As depicted in FIG. 4A, the air flow paths include a first flow path S1 formed on the outer periphery of the cooling fan 5 and curved arcuately, and the second flow path S2 formed on the rear side of the cooling fan 5 and connecting to the first flow path S1. The heatsink 34 is disposed in the second flow path S2. The sir flow paths further include a third flow path S3 formed on the rear side of the heatsink 34 and connecting to the second flow path S2. As described hereinabove, the electronic apparatus 1 has the power supply unit 40 at a rear portion thereof. The power supply unit 40 has the circuit board 41, and the case 42 that accommodates the circuit board 41 therein. The third flow path S3 is configured by the case 42, and the circuit board 41 is disposed in the third flow path S3 (refer to FIG. 5). The exhaust ports E1 and E2 are provided on the rear side of the case 42. A power supply circuit is mounted on the circuit board 41. The power supply circuit supplies driving power to various parts provided in the electronic apparatus 1.

When the cooling fan 5 is driven, air flows out from the cooling fan 5 to the first flow path S1. Thereafter, the air flows into the second flow path S2 and passes the heatsink 34. Then, the air flows into the third flow path S3. In particular, the air flows into the case 42 of the power supply unit 40. Thereafter, the air is discharged to the outside from the exhaust ports E1 and E2.

The metal plate 39 and the frame 20 have portions that function as walls that define the air flow path. In particular, the metal plate 39 and the frame 20 have portions that function as walls for partitioning an inner side and an outer side of the air flow paths. In the example of the electronic apparatus 1, the metal plate 39 and the frame 20 have portions that function as walls for defining the first flow path S1 and the second flow path S2. In this manner, the metal plate 39 has a function for increasing the rigidity of the frame 20 and a function as a wall for defining the flow paths S1 and S2. Consequently, the necessity for a member for exclusive use for defining the upper wall of the flow paths S1 and S2 is eliminated. As a result, the number of parts can be reduced. Further, the height of the electronic apparatus can be reduced by an amount corresponding to the member for exclusive use.

As depicted in FIGS. 4B and 6, the frame 20 has a flow path wall 22 that defines the first flow path S1 and the second flow path S2. The flow path wall 22 is a wall that defines an outer profile of the flow paths S1 and S2 as viewed in plan. The flow path wall 22 surrounds the cooling fan 5 and the heatsink 34 as viewed in plan.

In the example of the electronic apparatus 1, the flow path wall 22 has a curved wall portion 22A that surrounds the outer periphery of the cooling fan 5 and is curved along the outer periphery of the cooling fan 5. The first flow path S1 is formed between the cooling fan 5 and the curved wall portion 22A. The curved wall portion 22A is connected at one end portion thereof (in the example of the electronic apparatus 1, a right end portion) to the right wall portion 21B of the frame outer periphery 21. Accordingly, a front portion of the right wall portion 21B functions as part 22B of the flow path wall 22 (the part 22B is hereinafter referred to as first side wall portion 22B). The flow path wall 22 has a second side wall portion 22C that extends rearwardly from the other end portion of the curved wall portion 22A (in the example of the electronic apparatus 1, a left end portion). The second flow path S2 is formed between the first side wall portion 22B and the second side wall portion 22C. The inner side of the flow path wall 22 is open in the vertical direction.

As depicted in FIG. 6, the metal plate 39 has a portion 39A that functions as an upper side wall of the first flow path S1 and the second flow path S2 (the portion 39A is hereinafter referred to as flow path upper wall portion 39A). In particular, the flow path upper wall portion 39A closes up the upper side of the flow paths S1 and S2. The flow path upper wall portion 39A has a first wall portion 39Aa that functions as an upper side wall of the first flow path S 1, and a second wall portion 39Ab that functions as an upper side wall of the second flow path S2. The second wall portion 39Ab covers the heatsink 34.

As depicted in FIG. 6, the cooling fan 5 has, at a bottom portion thereof, an attachment plate 5c attached to the lower side of the frame outer periphery 21. The attachment plate 5c closes up the lower side of the first flow path S1 and functions as a lower side wall of the first flow path S1. Further, as described hereinabove, the upper chassis 32 is attached to the lower side of the frame outer periphery 21. The upper chassis 32 has a portion that functions as a lower side wall of the second flow path S2. Accordingly, the flow paths S1 and S2 are partitioned from a space therearound by the frame 20, the metal plate 39, the upper chassis 32, and the attachment plate 5c.

The flow path upper wall portion 39A of the metal plate 39 is connected to the flow path wall 22 of the frame 20. In particular, the flow path upper wall portion 39A is connected to the entire upper edge of the flow path wall 22 (namely, to an upper edge of the curved wall portion 22A and the side wall portions 22B and 22C). By the configuration just described, air in the flow paths S1 and S2 is suppressed from leaking to the outer side of the flow paths S1 and S2. In the example of the electronic apparatus 1, the frame 20 has a plurality of attachment portions 22a disposed along the flow path wall 22 and the frame outer periphery 21 as depicted in FIG. 6. The metal plate 39 is placed on the flow path wall 22 of the frame 20 and attached to the attachment portion 22a by a fixture such as a machine screw. Consequently, the flow path upper wall portion 39A of the metal plate 39 contacts closely with an upper edge of the flow path wall 22 of the frame 20

Figure 7:
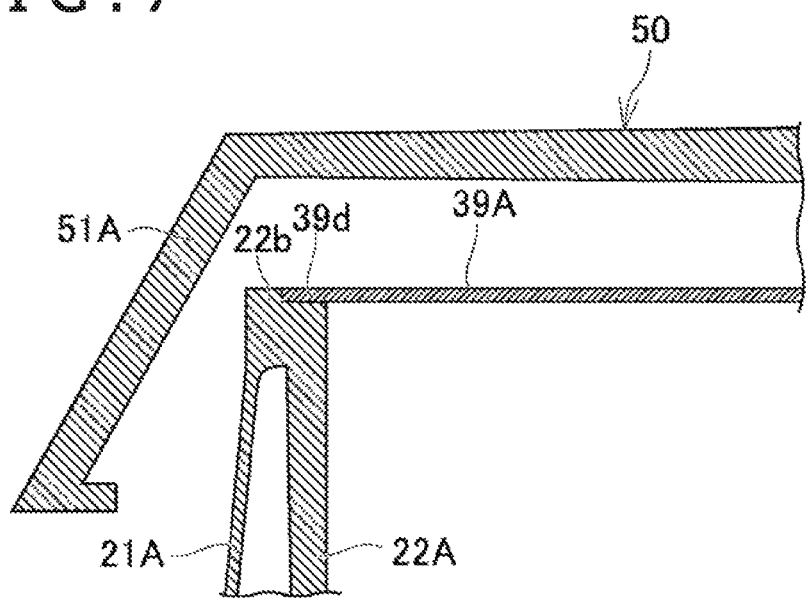
FIG. 7 is an enlarged view of a region indicated by reference character VII in FIG. 5.

FIG. 7 is an enlarged view of a region denoted by reference character VII in FIG. 5. As depicted in FIG. 7, the metal plate 39 has an edge positioned on the flow path wall 22 of the frame 20. A protrusion 22b is formed at an upper edge of the flow path wall 22 of the frame 20 along an edge of the metal plate 39 and positioned on the outer side of the edge of the metal plate 39. The protrusion 22b surrounds the edge of the metal plate 39. In the example of the electronic apparatus 1, a front edge 39d (refer to FIG. 6) of the first wall portion 39Aa the metal plate 39 has and a right edge 39e (refer to FIG. 6) of the second wall portion 39Ab are positioned on the flow path wall 22 of the frame 20 (more particularly, on the curved wall portion 22A and the first side wall portion 22B). The protrusion 22b is formed on an upper edge of the curved wall portion 22A and the first side wall portion 22B. The protrusion 22b is formed along edges 39d and 39e of the metal plate 39 and positioned on the outer sides of the edges 39d and 39e of the metal plate 39. Leakage of air from between the edges 39d and 39e of the metal plate 39 and the upper edge of the flow path wall 22 can be suppressed more effectively by the protrusion 22b.

As depicted in FIG. 6, the cooling fan 5 has a rotor 5a and a plurality of fins 5b that rotate integrally with the rotor 5a. The fins 5b extend in radial directions from the rotor 5a. A fin cover portion 39c is provided on the first wall portion 39Aa of the metal plate 39 and covers the upper side of a base portion of the fins 5b. In the example of the electronic apparatus 1, the fin cover portion 39c is formed annularly. The rotor 5a is positioned at the inner side of the fin cover portion 39c as viewed in plan view. In other words, the metal plate 39 does not exist above the rotor 5a. By the structure just described, the height of the electronic apparatus 1 can be reduced by an amount equal to the thickness of the metal plate 39. The shape of the metal plate 39 is not limited to this. For example, the fin cover portion 39c may not be provided on the metal plate 39, and the metal plate 39 may have a portion that covers the upper side of the rotor 5a.

As depicted in FIG. 6, a step is formed between the fin cover portion 39c and the first wall portion 39Aa. More particularly, the position of the first wall portion 39Aa is lower than the position of the fin cover portion 39c. Openings 39h are formed between an inner peripheral edge of the first wall portion 39Aa and an outer peripheral edge of the fin cover portion 39c. When the cooling fan 5 is driven, external air flows to the cooling fan 5 through the openings 39h. With the structure described above in which the position of the first wall portion 39Aa and the position of the fin cover portion 39c are displaced from each other in the vertical direction, it becomes easy to assure a size of the openings 39h. As a result, the air intake efficiency can be enhanced. The fin cover portion 39c is connected at an outer peripheral edge thereof to an inner peripheral edge of the first wall portion 39Aa through a plurality of connecting portions 39f.

As depicted in FIG. 1, the electronic apparatus 1 has, in the exterior member A thereof, an inlet P1 for taking in external air therethrough. In the example of the electronic apparatus 1, the inlet P1 is provided in a right side face and a left side face of the electronic apparatus 1. More particularly, a right wall portion 51B of the upper cover 50 and a right wall portion 61B of the lower cover 60 are positioned in a spaced relationship from each other in the vertical direction, and the inlet P1 is formed between the right wall portion 51B and the right wall portion 61B. An air flow path is formed between the right wall portion 21B of the frame outer periphery 21 and the right wall portion 51B of the upper cover 50, and air introduced in from the inlet P1 passes between the right wall portion 21B of the frame outer periphery 21 and the right wall portion 51B of the upper cover 50 and flows toward the upper side of the cooling fan 5. Similarly, another air flow path is formed between the right wall portion 21B of the frame outer periphery 21 and the right wall portion 61B of the lower cover 60, and air introduced in from the inlet P1 passes between the right wall portion 21B of the frame outer periphery 21 and the right wall portion 61B of the lower cover 60 and flows toward the lower side of cooling fan 5. The air coming to the lower side of the cooling fan 5 is introduced to the cooling fan 5 through an opening 5d formed in the attachment plate 5c. Also on the left side of the electronic apparatus 1, an inlet is provided similarly as on the right side of the electronic apparatus 1. The left wall portion of the upper cover 50 and the left wall portion of the lower cover 60 are positioned in a spaced relationship from each other in the vertical direction, and an inlet is formed between them. The position of the inlet is not limited to that of the example of the electronic apparatus 1 but may be changed suitably.

The metal plate 39 may have a portion that covers a part different from parts disposed along the air flow path such as the cooling fan 5 and the heatsink 34. In the example of the electronic apparatus 1, the optical disk drive 7 is disposed at the front portion of the electronic apparatus 1. As depicted in FIG. 6, the metal plate 39 has a portion 39B that covers the optical disk drive 7 (the portion 39B is hereinafter referred to as part cover portion 39B). In the example of the electronic apparatus 1, the optical disk drive 7 has, on the upper side of an upper face thereof, part of a mechanism for transporting an optical disk. The mechanism is covered with the part cover portion 39B. Where the optical disk drive 7 is covered with the metal plate 39 in this manner, the necessity for a cover for exclusive use for covering the optical disk drive 7 is eliminated. As a result, the number of parts can be reduced. Further, the height of the electronic apparatus can be reduced by an amount equal to the height of the cover for exclusive used.

The part covered by the part cover portion 39B is not limited to the optical disk drive 7. Alternatively, the metal plate 39 may not have the part cover portion 39B thereon. In other words, the entire metal plate 39 may function as the flow path upper wall portion 39A.

As described hereinabove, the air flow paths include the third flow path S3 following the second flow path S2. The wall that defines the third flow path S3 is configured from the case 42 of the power supply unit 40. The flow path upper wall portion 39A of the metal plate 39 and the flow path wall 22 of the frame 20 are connected to a vent 42d formed in the case 42. In the example of the electronic apparatus 1, the vent 42d is formed in a front face of the case 42 (refer to FIG. 3). As depicted in FIG. 5, a rear edge 39g of the flow path upper wall portion 39A of the metal plate 39 is connected to an upper edge of the vent 42d. The side wall portions 22B and 22C of the frame 20 are connected to left and right edges of the vent 42d. This can suppress leakage of air to the outer side between the second flow path S2 and the third flow path S3.

As described hereinabove, the electronic apparatus 1 has, as the exterior member A thereof, the upper cover 50 that covers the upper side of the main body 10 and the lower cover 60 that covers the lower side of the main body 10. Further, in the example of the electronic apparatus 1, part of the frame 20 is exposed to the outside from between the upper cover 50 and the lower cover 60. More particularly, the upper cover 50 has a peripheral wall 51 that surrounds the outer periphery of the frame outer periphery 21 as viewed in plan of the electronic apparatus 1. The lower cover 60 has a peripheral wall 61 that surrounds the outer periphery of the frame outer periphery 21 as viewed in plan of the electronic apparatus 1. A lower edge of the peripheral wall 51 of the upper cover 50 and an upper edge of the peripheral wall 61 of the lower cover 60 are spaced from each other in the vertical direction, and the frame outer periphery 21 is exposed to the outside from between the lower edge of the peripheral wall 51 of the upper cover 50 and the upper edge of the peripheral wall 61 of the lower cover 60. Accordingly, in the electronic apparatus 1, the exterior member A is configured from the covers 50 and 60 and the frame 20.

Figure 8:
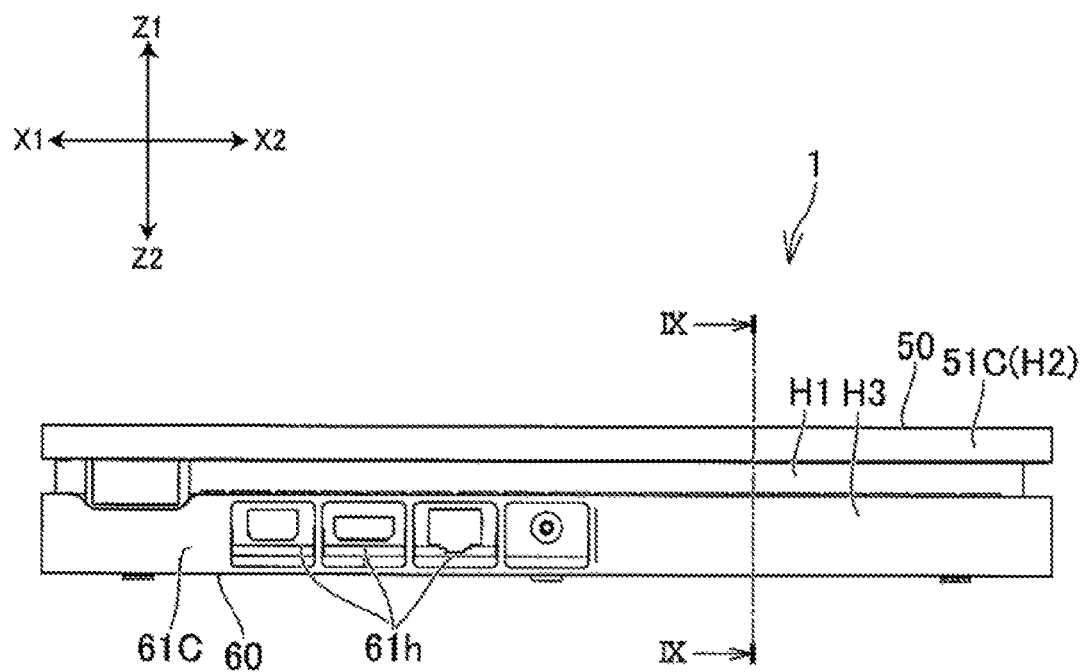
FIG. 8 is a rear elevational view of the electronic apparatus.

The exterior member A has the exhaust ports E1 and E2 for discharging air having passed through the air flow paths S1, S2, and S3 described hereinabove to the outside. FIGS. 8 to 10 depict a structure of the exhaust ports E1 and E2. FIG. 8 is a rear elevational view of the electronic apparatus 1. FIG. 9 is a sectional view taken along line IX-IX of FIG. 8. FIG. 10 is a perspective view depicting the rear side of the frame 20, the power supply unit 40, and the lower cover 60.

In the example of the electronic apparatus 1, the case 42 of the power supply unit 40 has an opening 42f provided at the rear side thereof (refer to FIG. 10). As depicted in FIG. 9, the exterior member A has the exhaust ports E1 and E2 at a rear portion of the case 42. Air in the case 42 (air in the third flow path S3) is discharged to the outside through the exhaust ports E1 and E2.

As depicted in FIG. 9, the exterior member A has a plurality of shielding portions provided at positions thereof behind the power supply unit 40. In the example of the electronic apparatus 1, the exterior member A includes three shielding portions H1, H2, and H3 provided thereon (in the following description, where the three shielding portions are to be identified from each other, they are referred to as first shielding portion H1, second shielding portion H2, and third shielding portion H3). The shielding portions H1, H2, and H3 are portions in the form of an elongated plate extending in the leftward and rightward direction. In the example of the electronic apparatus 1, the shielding portions H1, H2, and H3 have a length substantially corresponding to the width of the electronic apparatus 1 in the leftward and rightward direction.

In the example of the electronic apparatus 1, the first shielding portion H1 is provided on the rear wall portion 21C of the frame 20 as depicted in FIG. 9. The second shielding portion H2 is configured from a rear wall portion 51C that configures the peripheral wall 51 of the upper cover 50 and a panel portion 21m provided on the rear wall portion 21C of the frame 20. The rear wall portion 51C of the upper cover 50 is positioned behind the panel portion 21m of the frame 20 and configures the second shielding portion H2. The second shielding portion H2 may not necessarily be configured from two members. For example, the second shielding portion H2 may be configured only from the rear wall portion 51C of the upper cover 50.

The third shielding portion H3 configures a rear wall of an air flow path S5 hereinafter described. In the example of the electronic apparatus 1, the peripheral wall 61 of the lower cover 60 has a rear wall portion 61C as depicted in FIGS. 9 and 10. An upper side portion of the rear wall portion 61C configures a rear wall of the air flow path S5 and serves as the third shielding portion H3.

The shielding portions H1, H2, and H3 are not limited to the examples described here. Each of the shielding portions H1, H2, and H3 may be provided on any of the frame 20 and the covers 50 and 60. The number of shielding portions to be provided on the electronic apparatus 1 is not limited to three. The number of shielding portions may be two or four or more.

The shielding portions H1, H2, and H3 are juxtaposed in the vertical direction as viewed in the forward and rearward direction. In other words, the shielding portions H1, H2, and H3 are juxtaposed in the vertical direction as viewed in rear elevation of the electronic apparatus 1 as depicted in FIG. 8. In the example of the electronic apparatus 1, the second shielding portion H2 is positioned higher than the first shielding portion H1. The third shielding portion H3 is positioned on the opposite side to the position of the second shielding portion H2 across the position of the first shielding portion H1 in the vertical direction. In the example of the electronic apparatus 1, the third shielding portion H3 is positioned lower than the first shielding portion H1. The first shielding portion H1 and the second shielding portion H2 neighbor with each other in the vertical direction as viewed in the forward and rearward direction. In other words, if the first shielding portion H1 and the second shielding portion H2 are viewed in the forward and rearward direction, then any other shielding portion does not exist between the first shielding portion H1 and the second shielding portion H2. Similarly, if the first shielding portion H1 and the third shielding portion H3 are viewed in the forward and rearward direction, then they neighbor with each other in the vertical direction. In other words, when the first shielding portion H1 and the third shielding portion H3 are viewed in the forward and rearward direction, any other shielding portion does not exist between them.

If the first shielding portion H1 and the second shielding portion H2 are viewed in the forward and rearward direction, then they are preferably disposed such that part of the second shielding portion H2 overlaps with part of the first shielding portion H1. Where the first shielding portion H1 and the second shielding portion H2 are disposed in this manner, a part disposed on the inner side of the exterior member A (in the example of the electronic apparatus 1, the circuit board 41 of the power supply unit 40 or a part 41b mounted on the circuit board 41) can be prevented from being exposed to the outside from between the two shielding portions H1 and H2. In the example of the electronic apparatus 1, a lower edge of the second shielding portion H2 overlaps with an upper edge of the first shielding portion H1 as viewed in rear elevation of the electronic apparatus 1. In other words, the lower edge of the second shielding portion H2 and the upper edge of the first shielding portion H1 are positioned at the same height. The two shielding portions H1 and H2 may overlap with each other over a greater range. The first shielding portion H1 is positioned such that it overlaps with a part 41b mounted on the circuit board 41 as viewed in rear elevation of the electronic apparatus 1.

In the example of the electronic apparatus 1, the third shielding portion H3 is positioned lower than the lower edge of the first shielding portion H1. In other words, as viewed in rear elevation of the electronic apparatus 1, a very small gap is formed between the upper edge of the third shielding portion H3 and the lower edge of the first shielding portion H1. The air discharging efficiency can be enhanced by the gap. As hereinafter described in detail, the circuit board 41 is disposed in a displaced relationship from a center C2 of the first shielding portion H1 in the vertical direction to the second shielding portion H2 side. Therefore, the circuit board 41 or a part on the circuit board 41 can be suppressed from being exposed through the gap between the upper edge of the third shielding portion H3 and the lower edge of the first shielding portion H1. In place of the example of the electronic apparatus 1, the first shielding portion H1 and the third shielding portion H3 may be disposed such that, when they are viewed in the forward and rearward direction, part of the third shielding portion H3 overlaps with part of the first shielding portion H1. For example, the first shielding portion H1 and the third shielding portion H3 may be disposed such that the upper edge of the third shielding portion H3 overlaps with the lower edge of the first shielding portion H1 as viewed in rear elevation of the electronic apparatus 1.

The two shielding portions H1 and H3 may overlap with each other over a greater range. In this case, also the first shielding portion H1 and the second shielding portion H2 may be disposed such that part of the second shielding portion H2 overlaps with part of the first shielding portion H1 as viewed in rear elevation of the electronic apparatus 1.

As a further example, the upper edge of the third shielding portion H3 may be positioned lower than the lower edge of the first shielding portion H1 and besides the lower edge of the second shielding portion H2 described hereinabove may be positioned a little higher than the upper edge of the first shielding portion H1 (in other words, the two shielding portions H1 and H2 may have a gap therebetween and also the two shielding portions H1 and H3 may have a gap therebetween). In this case, preferably the gap between the upper edge of the third shielding portion H3 and the lower edge of the first shielding portion H1 and the gap between the lower edge of the second shielding portion H2 and the upper edge of the first shielding portion H1 are sized such that a user hardly visually recognize the circuit board 41 or the like through the gaps. As a still further example, conversely to the example of the electronic apparatus 1, the lower edge of the second shielding portion H2 may be positioned a little higher than the upper edge of the first shielding portion H1 and besides the upper edge of the third shielding portion H3 may be positioned at the same height with or lower than the lower edge of the first shielding portion H1 (in other words, while a gap is provided between the two shielding portions H2 and H1, no gap may be provided between the two shielding portions H1 and H3). In this case, the circuit board 41 may be disposed in a displaced relationship from the center C2 of the first shielding portion H1 in the vertical direction to the third shielding portion H3 side.

As depicted in FIG. 9, the first shielding portion H1 and the second shielding portion H2 are disposed in a displaced relationship from each other in the forward and rearward direction. The first exhaust port E1 described hereinabove is formed between the first shielding portion H1 and the second shielding portion H2. With the structure just described, the air discharging efficiency can be enhanced without leading to exposure of the circuit board 41 of the power supply unit 40 or the like by making the distance between the two shielding portions H1 and H2 greater in the forward and rearward direction. In the example of the electronic apparatus 1, the second shielding portion H2 is positioned behind the first shielding portion H1.

Preferably, the second shielding portion H2 and the first shielding portion H1 do not overlap with each other as viewed in plan. In other words, preferably the second shielding portion H2 is entirely positioned behind a rear end (upper end) of the first shielding portion H1. This makes it easy to assure a high air discharging efficiency.

As depicted in FIG. 9, also the first shielding portion H1 and the third shielding portion H3 are disposed in a displaced relationship from each other in the forward and rearward direction. The second exhaust port E2 is formed between the first shielding portion H1 and the third shielding portion H3. With the structure just described, the air discharging efficiency can be enhanced without leading to exposure of the circuit board 41 of the power supply unit 40 or the like by making the distance between the two shielding portions H1 and H3 greater. In the example of the electronic apparatus 1, the third shielding portion H3 is positioned behind the first shielding portion H1.

Preferably, also the third shielding portion H3 and the first shielding portion H1 do not overlap with each other as viewed in plan. In other words, preferably the third shielding portion H3 is entirely positioned behind the rear end (upper end) of the first shielding portion H1.

As depicted in FIG. 9, the second shielding portion H2 and the third shielding portion H3 are displaced in the same direction from the first shielding portion H1. By the structure just described, the width of the entire shielding portions H1, H2, and H3 in the forward and rearward direction can be reduced in comparison with an alternative structure that, for example, the second shielding portion H2 and the third shielding portion H3 are displaced from each other in the opposite directions to each other from the first shielding portion H1. As a result, the electronic apparatus 1 can be down-sized.

In the example of the electronic apparatus 1, both of the second shielding portion H2 and the third shielding portion H3 are positioned behind the first shielding portion H1. As a result, the second exhaust port E2 and the first exhaust port E1 are provided such that they oppose to each other in the vertical direction. The second exhaust port E2 positioned at the upper side is open downwardly while the first exhaust port E1 positioned at the lower side is open upwardly.

By the structure just described, the exhaust ports E1 and E2 can be prevented from being exposed to the outside. The layout of the shielding portions H1, H2, and H3 is not limited to the example described here. For example, the third shielding portion H3 may be positioned in front of the first shielding portion H1, and the second shielding portion H2 may be positioned behind the first shielding portion H1.

As depicted in FIG. 9, an air flow path S4 is formed at the upper side of the first shielding portion H1. Air having passed the air flow path S4 is discharged from the first exhaust port E1. As depicted in FIG. 10, a plurality of guide portions H4 are provided in the air flow path S4 such that they extend from the position of the first shielding portion H1 toward the second shielding portion H2. The guide portions H4 are juxtaposed in the leftward and rightward direction. A flow of air is guided in the forward and rearward direction by the guide portions h4. In the example of the electronic apparatus 1, the guide portions H4 are formed integrally with the frame 20. The guide portions H4 connect the upper edge of the first shielding portion H1 and the second shielding portion H2 to each other.

As described hereinabove, the air flow path S5 (refer to FIG. 9) is formed at the lower side of the first shielding portion H1. Air having passed the air flow path S5 is discharged from the second exhaust port E2. As depicted in FIG. 10, a plurality of guide portions H5 are provided in the air flow path S5 such that they extend from the position of the first shielding portion H1 toward the third shielding portion H3. The guide portions H5 are juxtaposed in the leftward and rightward direction. A flow of air is guided in the forward and rearward direction by the guide portions H5. In the example of the electronic apparatus 1, the guide portions H5 are formed integrally with the frame 20. More particularly, the guide portions H5 are formed on a bottom panel portion 21g that defines the bottom of the air flow path S5.

As described hereinabove, the power supply unit 40 is disposed in front of the shielding portions H1, H2, and H3. The circuit board 41 is disposed at the inner side of the case 42 of the power supply unit 40. As depicted in FIG. 9, the circuit board 41 is disposed in a displaced relationship from the center C2 of the first shielding portion H1 in the vertical direction to the second shielding portion H2 side. In the example of the electronic apparatus 1, the circuit board 41 is displaced upwardly from the center C2 of the first shielding portion H1. The distance between the second shielding portion H2 and the circuit board 41 in the forward and rearward direction is greater than the distance between the first shielding portion H1 and the circuit board 41 in the forward and rearward direction. With such a layout of the circuit board 41 and the second shielding portion H2 as just described, the circuit board 41 can be suppressed from making an obstacle to a flow of air.

As depicted in FIG. 9, a rear edge 41a of the circuit board 41 is positioned in front of the first shielding portion H1. An air flow path is formed between the rear edge 41a of the circuit board 41 and the first shielding portion H1. With the layout just described, air flowing at the lower side of the circuit board 41 can be discharged from the first exhaust port E1 past the flow path between the rear edge 41a of the circuit board 41 and the first shielding portion H1. As a result, the cooling performance for a part mounted on the circuit board 41 can be enhanced.

In the example of the electronic apparatus 1, the circuit board 41 is positioned higher than the upper edge of the first shielding portion H1. Consequently, the distance between the rear edge 41a of the circuit board 41 and the first shielding portion H1 can be assured readily, and a flow of air passing the air flow path formed between them can be further smoothened.

As depicted in FIG. 9, the first shielding portion H1 is inclined such that the distance between the circuit board 41 and the first shielding portion H1 increases toward the second shielding portion H2. In other words, the first shielding portion H1 is inclined such that an upper portion thereof is positioned behind a lower portion thereof. With the structure of the first shielding portion H1, the distance between the rear edge 41a of the circuit board 41 and the first shielding portion H1 is more likely to be assured, and a flow of air can be further smoothened.

In the example of the electronic apparatus 1, the second shielding portion H2 and the third shielding portion H3 are inclined to the rear side similarly to the first shielding portion H1. The shielding portions H1, H2, and H3 may not necessarily be inclined. In other words, the shielding portions H1, H2, and H3 may be disposed vertically.

As depicted in FIG. 9, a protrusion 42b is formed on an upper wall portion 42a of the case 42 so as to project downwardly. The circuit board 41 is positioned at a lower end of the protrusion 42b and is spaced downwardly from the upper wall portion 42a. Consequently, the circuit board 41 or the part 41b mounted on the circuit board 41 can be prevented from being visually recognized from the outside through the first exhaust port E1. In the example of the electronic apparatus 1, the protrusion 42b has a form of a wall extending in the forward and rearward direction.

As described hereinabove, the circuit board 41 is disposed in an upwardly displaced relationship from the center C2 of the first shielding portion H1 in the vertical direction. Various parts (parts such as, for example, a transformer that configures a power supply circuit) are mounted on a lower face of the circuit board 41. The air flow path S5 is formed on the lower side of the first shielding portion H1, and the second exhaust port E2 for discharging air in the air flow path S5 is formed between the first shielding portion H1 and the third shielding portion H3. With the layout of the circuit board 41 and the second exhaust port E2, air passing the part 41b of the circuit board 41 (air passing a lower portion of the case 42) can be discharged smoothly from the second exhaust port E2. As a result, the cooling performance for parts mounted on the circuit board 41 can be enhanced.

As depicted in FIG. 9, the second shielding portion H2 is spaced by a great distance from the case 42 in comparison with the first shielding portion H1. The case 42 has a wall portion that defines the air flow path S4 which extends to the first exhaust port E1. In the example of the electronic apparatus 1, the case 42 has the upper wall portion 42a and a lower wall portion 42c.

The upper wall portion 42a extends rearwardly by a greater distance than the lower wall portion 42c. The upper wall portion 42a is connected at a rear edge 42g thereof to the second shielding portion H2. More particularly, the rear edge 42g of the upper wall portion 42a is connected to the upper end of the second shielding portion H2. The air flow path S4 is defined by the upper wall portion 42a. The structure of the case 42 is not limited to the example described here. For example, in place of the upper wall portion 42a of the case 42, a panel portion configuring an upper wall of the air flow path S4 formed at the upper side of the first shielding portion H1 may be provided on the rear wall portion 21C of the frame 20.

The bottom of the air flow path S5 formed on the lower side of the first shielding portion H1 is defined by the bottom panel portion 21g. The bottom panel portion 21g is provided on the rear wall portion 21C of the frame 20. The case 42 is connected at a rear edge 42h of the lower wall portion 42c thereof to a front edge of the bottom panel portion 21g.

Various parts may be disposed also below the power supply unit 40. For example, in the example of the electronic apparatus 1, a hard disk apparatus 8 is disposed below the power supply unit 40 as depicted in FIG. 9. The hard disk apparatus 8 is covered at the lower side thereof with the lower cover 60.

Further, a part such as a connector mounted on the circuit board 31 may be disposed below the power supply unit 40. In this case, as depicted in FIG. 10, the rear wall portion 21C of the frame 20 and the rear wall portion 61C of the lower cover 60 may have openings 21h and 61h formed therein for exposing connectors to the rear therethrough.

As described hereinabove, the electronic apparatus 1 has the metal plate 39. The metal plate 39 is disposed on the opposite side to the chassis 32 and 33 and the circuit board 31 across the cooling fan 5 and attached to the frame 20. With such a structure as just described by which the metal plate 39 is utilized, the rigidity of the frame 20 can be improved without increasing the thickness of the wall portions 21A, 21B, 21C, and 21D of the frame 20.

Further, the exterior member A of the electronic apparatus 1 has the first shielding portion H1 and the second shielding portion H2 disposed in a displaced relationship from each other in the forward and rearward direction. The first exhaust port E1 described hereinabove is formed between the first shielding portion H1 and the second shielding portion H2. With the structure just described, by making the distance between the two shielding portions H1 and H2 greater in the forward and rearward direction, the air discharging efficiency can be enhanced without leading to exposure of the circuit board 41 of the power supply unit 40 or the like.

It is to be noted that the exterior member A herein signifies a member that configures at least part of an outer face of the electronic apparatus. Accordingly, the exterior member A is not limited to any of the covers 50 and 60 and the frame 20. For example, a different member may be attached to the cover 50 or 60 (here, the member attached to the cover 50 or 60 is referred to as attached member). If the attached member is exposed partly or entirely to the outer face of the electronic apparatus, then also the attached member configures the exterior member A. In this case, all or part of the shielding portions H1, H2, and H3 may be provided on the attached member.

Further, in the example of the electronic apparatus 1, the shielding portions H1, H2, and H3 are formed integrally on the exterior member A. In particular, the first shielding portion H1 is formed integrally with the frame 20. Meanwhile, the rear wall portion 51C configuring the second shielding portion H2 is formed integrally with the upper cover 50, and the panel portion 21m configuring the second shielding portion H2 is formed integrally with the frame 20.

Further, the third shielding portion H3 is formed integrally with the lower cover 60. However, each of the shielding portions H1, H2, and H3 may be a member formed separately from the exterior member A. Further, the shielding portions H1, H2, and H3 may be attached to the exterior member A using a fixture such as a machine screw or using an engaging pawl formed on the shielding portions H1, H2, and H3.

The present technology is not limited to the embodiment described above and can be carried out in various altered forms.

For example, in the electronic apparatus 1, the exhaust ports E1 and E2 may not be formed by the shielding portions H1, H2, and H3 displaced from each other in the forward and rearward direction.

Further, the electronic apparatus 1 may not necessarily have such a part as the optical disk drive 7 or the power supply unit 40.

The present technology contains subject matter related to that disclosed in Japanese Priority Patent Application JP 2016-073336 filed in the Japan Patent Office on Mar. 31, 2016, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
a plurality of parts;
a frame having an outer periphery surrounding the plurality of parts and formed from resin, where an air flow path is formed at an inner side of the outer periphery of the frame;
a circuit board disposed at one side in a first direction with respect to the plurality of parts;
a chassis disposed at the one side in the first direction with respect to the plurality of parts, attached to the frame, and formed from metal; and
a metal plate disposed at an other side in the first direction with respect to at least one of the plurality of parts and attached to the frame, wherein:
the metal plate and the frame each have a respective portion that functions as a wall defining the air flow path,
the respective portion of the frame is a flow path wall portion that defines an outer shape of the air flow path when the air flow path is viewed in the first direction, and
the respective portion of the metal plate is connected to the flow path wall portion of the frame.

2. The electronic apparatus according to claim 1, wherein the outer periphery of the frame has a first wall portion positioned in a second direction orthogonal to the first direction with respect to the plurality of parts, a second wall portion positioned at the opposite side to the first wall portion across the plurality of parts, a third wall portion positioned in a third direction orthogonal to the first direction with respect to the plurality of parts, and a fourth wall portion positioned at the opposite side to the third wall portion across the plurality of parts, and
the metal plate is attached to at least three wall portions from among the first, second, third, and fourth wall portions.

3. The electronic apparatus according to claim 1, wherein the metal plate and the chassis are attached to the outer periphery of the frame.

4. The electronic apparatus according to claim 1, wherein the portion of the metal plate functions as a wall of the air flow path at the other side in the first direction.

5. The electronic apparatus according to claim 1,
wherein the metal plate has an edge disposed on the flow path wall portion of the frame, and
a protrusion is formed along the edge of the metal plate at the flow path wall portion of the frame and positioned at the outer side of the edge of the metal plate.

6. The electronic apparatus according to claim 5, wherein the plurality of parts include a cooling fan,
the cooling fan is disposed such that a rotational center line thereof is directed to the first direction, and
the flow path wall portion of the frame surrounds the outer periphery of the cooling fan.

7. The electronic apparatus according to claim 6, wherein a heatsink is disposed in the air flow path, and the metal plate covers the cooling fan and the heatsink.

* * * * *